US006301547B2

(12) United States Patent
Felps

(10) Patent No.: US 6,301,547 B2
(45) Date of Patent: *Oct. 9, 2001

(54) METHOD AND APPARATUS FOR AUTOMATICALLY ACQUIRING A WAVEFORM MEASUREMENT

(75) Inventor: Jimmie D Felps, Colorado Springs, CO (US)

(73) Assignee: Agilent Technologies Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 10 days.

(21) Appl. No.: 09/184,105

(22) Filed: Nov. 2, 1998

(51) Int. Cl.[7] .......................... G01R 13/02; G01R 13/00; G06F 19/00
(52) U.S. Cl. ................................................ 702/67; 702/66
(58) Field of Search ................................. 702/57, 64–66, 702/67–76, 79, 80, 124–126, 189, 193, 198, 199; 345/134; 324/76.19

(56) References Cited

U.S. PATENT DOCUMENTS

| 3,662,380 | * | 5/1972 | Cargile | 341/110 |
| 3,836,851 | * | 9/1974 | Schumann | 324/112 |
| 4,495,586 | * | 1/1985 | Andrews | 702/66 |
| 4,743,844 | * | 5/1988 | Odenheimer et al. | 324/121 R |
| 4,802,098 | * | 1/1989 | Hansen et al. | 702/67 |
| 5,162,724 | * | 11/1992 | Katayama et al. | 324/76.19 |
| 5,375,067 | * | 12/1994 | Berchin | 702/66 |
| 6,073,264 | * | 6/2000 | Nelson et al. | 714/738 |
| 6,078,872 | * | 6/2000 | Carson et al. | 702/69 |

FOREIGN PATENT DOCUMENTS

| 0349328 | 6/1989 | (EP) | G01R/13/34 |
| 0515028A1 | 4/1992 | (EP) | G01R/13/32 |

OTHER PUBLICATIONS

Hewlett Packard. Measurement/Computation. Electronic Instruments and Systems 1983 pp. 148, 149.*

* cited by examiner

Primary Examiner—Kamini Shah
Assistant Examiner—Manuel L. Barbee
(74) Attorney, Agent, or Firm—Patrick J. Murphy

(57) ABSTRACT

A method and apparatus for automatically acquiring and storing a waveform measurement using a measuring instrument having a video display, such as an oscilloscope or spectrum analyzer, is disclosed. According to the invention, an operator first instructs the measuring instrument to automatically measure a probed waveform one or more times and to automatically store at least one selected sample set representing each probed waveform measurement. Thereafter, the operator is not required to interact with the measuring instrument during a measurement or series of measurements. Once measurement acquisition and storage is automatically completed, the measuring instrument alerts the operator by providing at least one indication for each selected sample set stored. The invention offers several advantages, for example, by allowing the operator to focus on a measurement probe in contact with a waveform source, instead of diverting his or her attention to observe the graphic display or otherwise interact with the measurement instrument during one or more measurement operations.

34 Claims, 4 Drawing Sheets

METHOD AND APPARATUS FOR AUTOMATICALLY ACQUIRING A WAVEFORM MEASUREMENT

FIELD OF THE INVENTION

This invention relates to electronic signal measurement techniques, and more particularly to a method and apparatus for automatically acquiring and storing a waveform measurement using a measuring instrument having a video display.

BACKGROUND OF THE INVENTION

Several measuring instruments are known in the art which are commonly used to measure or monitor an electronic signal or waveform. The electronic signal or waveform may be present, for example, on any one of the pins of an integrated circuit (IC) package, or on leads or terminations of various other circuit components.

Some measuring instruments, such as digital multimeters, measure a single signal or electronic component value at a particular instant of time during a typical measurement operation. In contrast, other measuring instruments, for example an oscilloscope or a spectrum analyzer, measure a set of signal values over a period of time during a measurement operation, wherein the set of values constitutes a waveform. Hence, for purposes of the present invention, "signals" are differentiated from "waveforms" in that the former is represented as a single value, whereas the latter includes a set of individual signal values at different instances of time. The present invention is directed particularly to measuring instruments which have the capability to automatically acquire and store measurements of waveforms.

Waveform measuring instruments typically include a video display for illustrating a two-dimensional temporal or spectral representation of the measured waveform. For example, an oscilloscope typically measures and displays the amplitude of a waveform with respect to time, while a spectrum or network analyzer processes the amplitude-versus-time information of a waveform to display the frequency components of the waveform. Some oscilloscopes may also have the capability to display the amplitude information of a first waveform on a first axis versus the amplitude information of a second waveform on a second axis. Hence, for purposes of the present invention, "video display" refers to a visual display of a waveform measuring instrument on which at least one two-dimensional representation of one or more waveforms may be illustrated. Specifically, each representation displayed by the video display has at least two axes or "dimensions," for example, a vertical axis and a horizontal axis.

Waveform measuring instruments are known which have the capability to store in memory one or more two-dimensional representations of probed waveforms for displaying the representations at some later time. As discussed above, such waveform measuring instruments must measure and store a set of signal values to represent a waveform, as opposed to merely measuring a single value. The process of acquiring and storing a waveform measurement using such instruments typically requires an operator to apply, and in some cases hold, a measurement probe to a waveform source, to watch the graphic display of the measuring instrument to view the probed waveform, and to wait until the display indicates that the probed waveform has stabilized. Once the waveform has stabilized, the operator must often specifically instruct the measuring instrument to acquire a measurement of the probed waveform.

Typically, waveform acquisition is accomplished by "sampling" the waveform for some period of time, or "waveform acquisition period." During a waveform acquisition period, the measuring instrument may collect several "sample sets" of values, each sample set including a number of individual signal values necessary to represent the waveform on the video display. For example, a particular video display may be designed to have a horizontal resolution of 500 points in a given time frame to represent a waveform. In this case, each sample set would include 500 individual signal values dispersed in time throughout the time frame represented on the video display. The waveform acquisition period is often determined arbitrarily by the operator manually stopping or "freezing" the acquisitions, perhaps after some desired number of sample sets have been acquired.

After the operator instructs the instrument to stop acquisitions, the operator may in some cases further instruct the measuring instrument to store one particular or "selected" sample set representing the probed waveform, based on the acquired sample sets. This "acquire and store" instruction process is often accomplished by the operator pressing one or more buttons on an operator interface panel of the measuring instrument. Generally, both software routines executed by a processor in the measuring instrument, as well as hardware circuitry, initiate the acquire and store processes by interpreting the selections made by the operator via the buttons of the operator interface panel.

In contrast to conventional acquisition and storage of a waveform measurement as outlined above, a measuring instrument such as a digital multimeter typically measures and displays, in alpha-numeric form, only a single value associated with a signal or circuit component at a particular instant of time, as opposed to a set of values. Some digital multimeters may additionally have a limited ability to store a single signal measurement to be recalled and displayed numerically at a later time, or may sound a "beep" to indicate that a particular measurement is ready for observation on the alpha-numeric display. Digital multimeters, however, do not acquire and store sets of values corresponding to two-dimensional representations of waveforms, and do not display stored waveform representations on a video display, as do measuring instruments such as oscilloscopes and spectrum analyzers.

With respect to the electrical connection of a waveform measuring instrument to a waveform source, various terminations or measurement probes are known for placing a wire or cable attached to a measuring instrument in contact with a waveform source. Some terminations, for example, a probe with a fine "tip," require an operator to hold the termination to the waveform source during a measurement. This requirement may pose particular challenges to the operator during conventional manual waveform measurement acquisition and storage operations, as discussed further below.

One problem encountered during manual waveform measurement operations relates to measurement probe "slippage." This problem may be particularly exacerbated by ongoing improvements in semiconductor and printed circuit board technology. For example, with continued advances in semiconductor fabrication technology, the size of integrated circuits (ICs) becomes progressively smaller. One consequence of reduced IC package size is that the connection terminals or "pins" of the IC are smaller and are closer together, or more densely packed. The packing density and size of IC pins is referred to as "lead pitch." Reduced IC package size also results in printed circuit boards that are more densely occupied by IC chips and other circuit components.

In view of the foregoing, it is to be appreciated that in many instances, acquisition and storage of waveform measurements requires careful application of a measurement probe to a waveform source in order to avoid probe slippage. In such cases, the operator may choose to summon an assistant to perform the manual "stop acquisition and store" functions so that the operator's attention is not diverted from the probe in contact with the waveform source. Examples of potentially challenging waveform measurements include using a fine tip probe on densely packed printed circuit boards having ICs with a small lead pitch, as discussed above, or applying a measurement probe to an IC or a component in a difficult to reach position.

Alternatively, to facilitate the stop acquisition and storage functions and alleviate the need for an assistant, some known measurement probes are equipped with a button to allow the operator to "remotely" perform these functions, in lieu of a button on an operator interface panel of the measuring instrument. Other more elaborate schemes are known for facilitating remote operator instruction of a measuring instrument, some of which employ, for example, a foot pedal or a sound sensitive trigger, such as a voice recognition device, so that the operator may indicate to the measuring instrument to stop acquisitions and/or store an acquired waveform measurement without having to touch the measuring instrument itself.

The above alternative solutions for remotely acquiring and storing a waveform measurement often suffer several disadvantages, however, in that 1) they nonetheless require the operator to look at the video display of the measuring instrument to determine if a probed waveform has stabilized, and 2) the acquisition and storage operations are still performed manually, thereby requiring manual action by the operator or an assistant. This need for the operator to monitor the display and to perform manual operations, either remotely or proximately with the measuring instrument, limits the operator's ability to concentrate on the measurement probe, or to perform some other task during a measurement. In particular, while the operator's attention is diverted from the measurement probe to the video display or the manual operation, especially in the case of a fine tip probe, the probe may slip off of the pin, lead, or termination carrying the waveform of interest.

The risk of accidental probe movement may be especially aggravated in the case of an operator pushing a stop acquisition and/or storage button on a probe equipped with such a button. As discussed above, as the lead pitch on integrated circuits becomes smaller and the component density of printed circuit boards increases, any disturbance of measurement probe placement poses a greater risk of causing damage to a circuit, by contacting or "shorting" multiple pins or component leads with the probe while the operator looks away from the probe to observe a visual display, or pushes a button to stop sample acquisition and store a waveform measurement.

SUMMARY OF THE INVENTION

Accordingly, in view of the foregoing, the present invention is directed to methods and apparatus for automatically acquiring and storing a waveform measurement using a measuring instrument having a video display. Waveform measuring instruments suitable for purposes of the present invention include, but are not limited to, oscilloscopes, spectrum analyzers, and network analyzers. The invention provides several advantages in that it allows an operator to be free to perform other tasks during a waveform measurement operation. In particular, according to the invention, an operator's attention need not be diverted from the vicinity of the waveform source during a measurement.

According to one aspect of the invention, an operator is relieved from such tasks as verifying waveform stabilization on a video display, terminating waveform acquisition, and initiating storage of a waveform measurement. For waveform measurements in which a measurement probe is used to contact a waveform source, the invention particularly reduces the risk of the probe slipping and making an unreliable measurement and/or possibly "shorting out" and damaging circuitry. In general, the method and apparatus of the invention affords the operator a greater degree of freedom in making waveform measurements and provides an efficient, low cost, and easy to implement solution for waveform measuring instruments to automatically acquire and store waveforms and indicate successful storage thereof to an operator. Specifically, the present invention is especially useful for monitoring waveforms from ICs with very small lead pitch.

According to a feature of the invention, an operator performs one or more setup steps on the measuring instrument to instruct the measuring instrument to begin an automatic acquisition, storage, and indication procedure. Once the measuring instrument is instructed, the operator is not required to interact further with the instrument during the course of a waveform measurement.

In one embodiment, the invention provides for the automatic acquisition and storage of a number of waveform measurements in succession, as well as the indication of successful acquisition and storage of each measurement. Each measurement in a succession of measurements is independent and may be taken from the same pin of an IC, a different pin of the same IC, an entirely different IC, various other circuit components or terminations, or combinations of the above. Once automatic waveform acquisition and storage are completed for a single waveform measurement, the measuring instrument alerts the operator of a successful measurement by providing at least one indication, for example, by sounding one or more audible indications or patterns of indications. The operator may then keep the probe on the source, or remove the probe from the waveform source and apply it elsewhere to a new source, to automatically proceed with a subsequent measurement. In this manner, the invention affords the operator the freedom to perform other tasks, and in particular, to keep his or her attention on a measurement probe in contact with a waveform source throughout a series of waveform measurements, if desired.

Other advantages, novel features, and objects of the invention will become apparent from the following detailed description of the invention when considered in conjunction with the accompanying drawings.

BRIEF DESCRIPTION OF THE DRAWINGS

The accompanying drawings, which are incorporated herein by reference, are schematic and are not intended to be drawn to scale. In the drawings, each identical or nearly identical component that is illustrated in various figures is represented by a like numeral. For purposes of clarity, not every component may be labeled in every drawing.

In the drawings.

DETAILED DESCRIPTION

Figure 1:
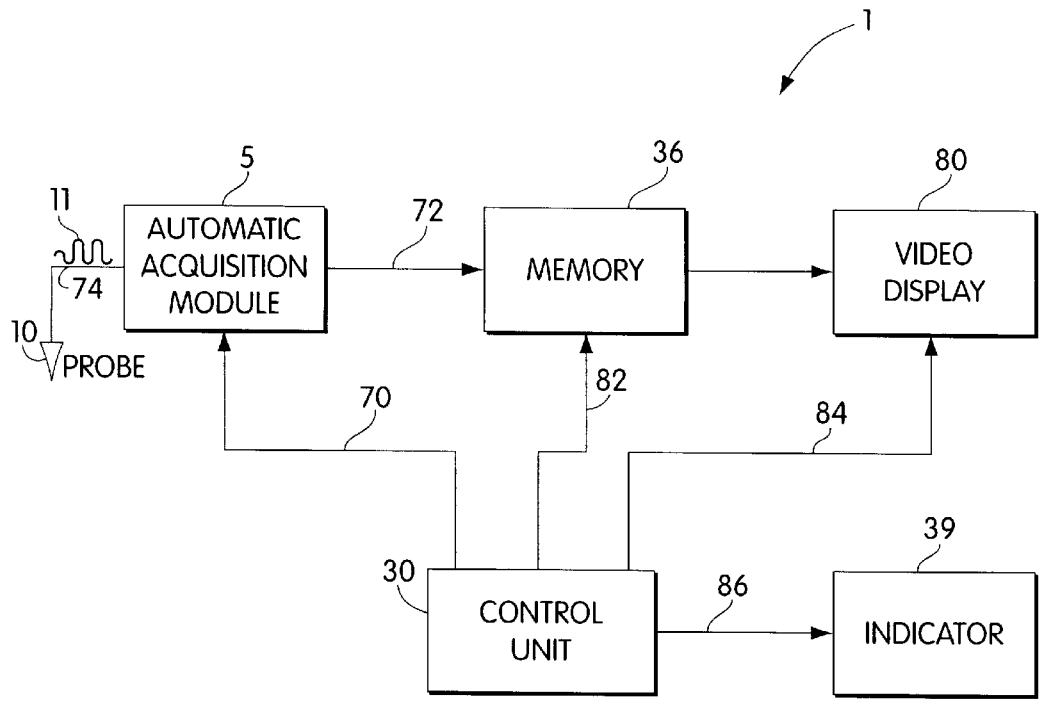
FIG. 1 is a block diagram of a waveform measuring instrument including an example of one apparatus according to the invention.

FIG. 1 is a simplified schematic block diagram of a waveform measuring instrument 1 including an example of an apparatus according to the invention. The waveform measuring instrument of FIG. 1 may be, for example, an oscilloscope, a spectrum analyzer, or a network analyzer. FIG. 1 shows that the waveform measuring instrument 1 includes a control unit 30, coupled to an automatic acquisition module 5 via line 70, a memory 36 via line 82, a video display 80 via line 84, and an indicator 39 via line 86. Each of lines 70, 72, 82, 84 and 86 may include one or more conductors.

In FIG. 1, the automatic acquisition module 5 automatically acquires one or more acquired sample sets of a probed waveform 11 present on cable 74, as measured by a measurement probe 10 during a waveform acquisition period. Automatic acquisition module 5 also determines a selected sample set, based on the acquired sample sets, at an expiration of the waveform acquisition period. The control unit 30 controls the automatic acquisition module 5 via control line 70 and the memory 36 via line 82 to store in memory 36, via line 72, each selected sample set determined by module 5. The control unit 30 also controls the memory 36 and the video display 80 such that each stored sample set may be retrieved from memory 36, and the waveform represented by the selected sample set may be viewed on video display 80.

As shown in FIG. 1, measurement probe 10 is used to monitor a waveform of interest carried by a waveform source, such as an IC pin, a component lead, or a circuit termination. While measurement probe 10 is illustrated in FIG. 1 as a "tipped" implement, for purposes of the invention, the probed waveform 11 may be derived from any one of several terminations known in the art serving as a measurement probe. Examples of terminations suitable for use as a measurement probe according to the invention include, but are not limited to, a cable equipped with a tipped probe as shown, a BNC termination, a "banana-type" termination, a "clip-lead" termination, and the like. Similarly, cable 74 carrying the probed waveform 11 may be connected to the measuring instrument using any number of appropriate connections known in the art.

Furthermore, for purposes of the present invention, the probed waveform 11 refers to the waveform being acquired by automatic acquisition module 5 at any given time; for example, at two different instances of time, the probed waveform 11 may be derived from the same waveform source, or two different waveform sources, respectively, as the operator is free to move the measurement probe 10 among several possible sources.

In particular, it is to be appreciated that the automatic acquisition module 5 may acquire a number of waveform measurements in succession. For each waveform measurement, the automatic acquisition module 5 acquires one or more sample sets and determines a selected sample set based on the acquired sample sets, and the control unit 30 causes each selected sample set to be stored in memory 36. For a series of waveform measurements, an operator has the option to specify a delay time between consecutive acquisition and storage operations for each measurement, as discussed further below.

Figure 2:
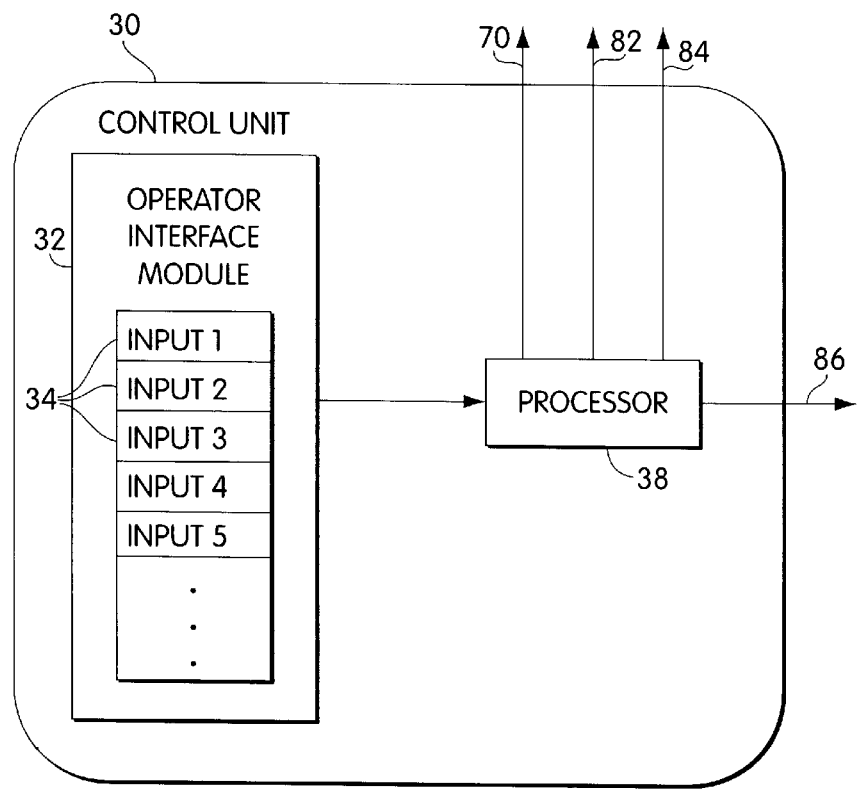
FIG. 2 is a detailed block diagram of a control unit of the apparatus of FIG. 1.

FIG. 2 is a more detailed block diagram of the control unit 30. FIG. 2 shows that the control unit 30 includes an operator interface module 32 for providing instructions to the measuring instrument, and a processor 38, coupled to the operator interface module 32, as well as the automatic acquisition module 5 via line 70, to the memory 36 via line 82, to the video display 80 via line 84, and to the indicator 39 via line 86. The processor 38 controls the module 5, the memory 36, the video display 80 and the indicator 39 based on the instructions provided via the inputs 34 of the operator interface module 32.

The operator interface module 32 includes a number of operator inputs 34 for providing specific instructions to the measuring instrument. For example, the operator inputs 34 can be used to specify the waveform acquisition period, as well as an auto-store delay time between selections and storage of consecutive selected sample sets for a succession of waveform measurements. With respect to the waveform acquisition period, the operator may utilize one of the operator inputs 34 to specify the waveform acquisition period as, for example, a predetermined measurement time or as a predetermined count of acquired sample sets.

Returning to FIG. 1, the example of an apparatus according to the invention includes an indicator 39 to provide at least one indication that each selected sample set has been successfully determined by the automatic acquisition module 5 and stored in memory 36. Examples of possible indications provided by the indicator 39 include, but are not limited to, audible tones, visual indications using a lamp or LED, messages or pictorial representations superimposed on the video display, one or more patterns of audible tones of various durations and/or pitches, audible voice messages, or combinations of the above.

A unique mode of indication may be specified by the operator using an input 34 of the operator interface module 32, such that the operator is informed of various aspects of successful measurement acquisition and storage. For example, in a series of automatic waveform measurements, a unique predetermined pattern of duration, number, or pitch of audible tones indicating a particular acquisition or storage event can be assigned by the operator to each of a sequence of selected sample sets, so that the operator may be informed of how many measurements have been acquired and stored. Additionally, as discussed above, the various audible indications of a particular indication mode may also include voice messages, for example, identifying the number of acquired measurements, and may be accompanied by one or more visual indications as well, for example, a message or pictorial representation superimposed on the video display of the measuring instrument, an LED or other lamp illuminated on the operator interface panel, and the like.

Figure 3:
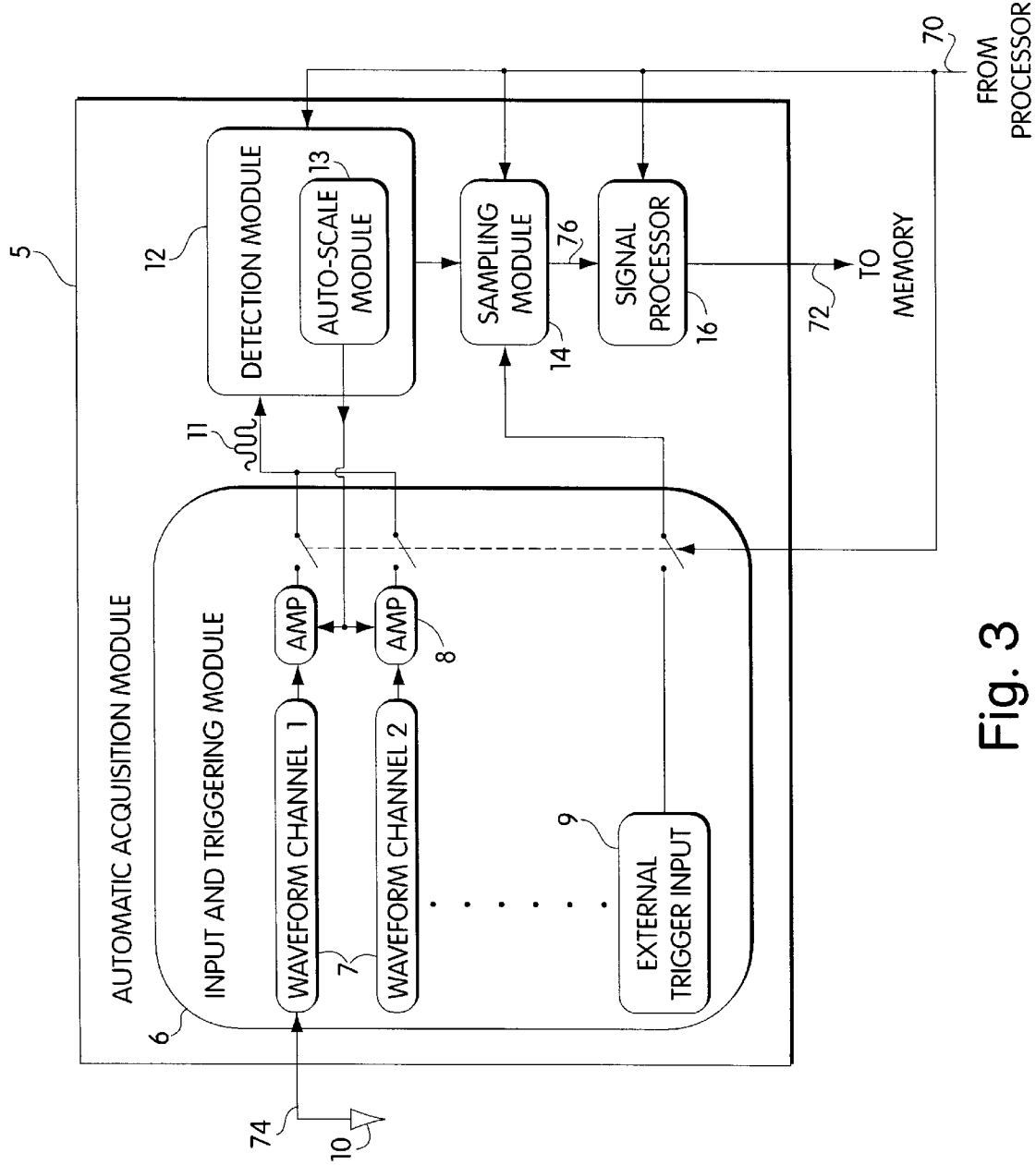
FIG. 3 is a detailed block diagram of an automatic acquisition module of the apparatus of FIG. 1.

FIG. 3 is a more detailed block diagram of the automatic acquisition module 5. The automatic acquisition module 5 includes a detection module 12 to monitor a parameter of the probed waveform 11, to detect a change in the monitored parameter, and to wait a predetermined stabilization time for the monitored parameter to be substantially constant. Automatic acquisition module 5 also includes a sampling module 14 to acquire, after the predetermined stabilization time, the acquired sample sets. The sampling module 14 also automatically stops acquisitions of the acquired sample sets at the expiration of the waveform acquisition period. The automatic acquisition module 5 further includes a signal processor 16, connected to sampling module 14 via line 76, to process the acquired sample sets and to determine a particular selected sample set from the acquired sample sets for each waveform measurement operation. The signal processor 16 outputs each selected sample set to the memory 36 via line 72. Processor 38 of the control unit 30 controls the detection module 12, the sampling module 14, and the signal processor 16 via line 70.

Figure 4:
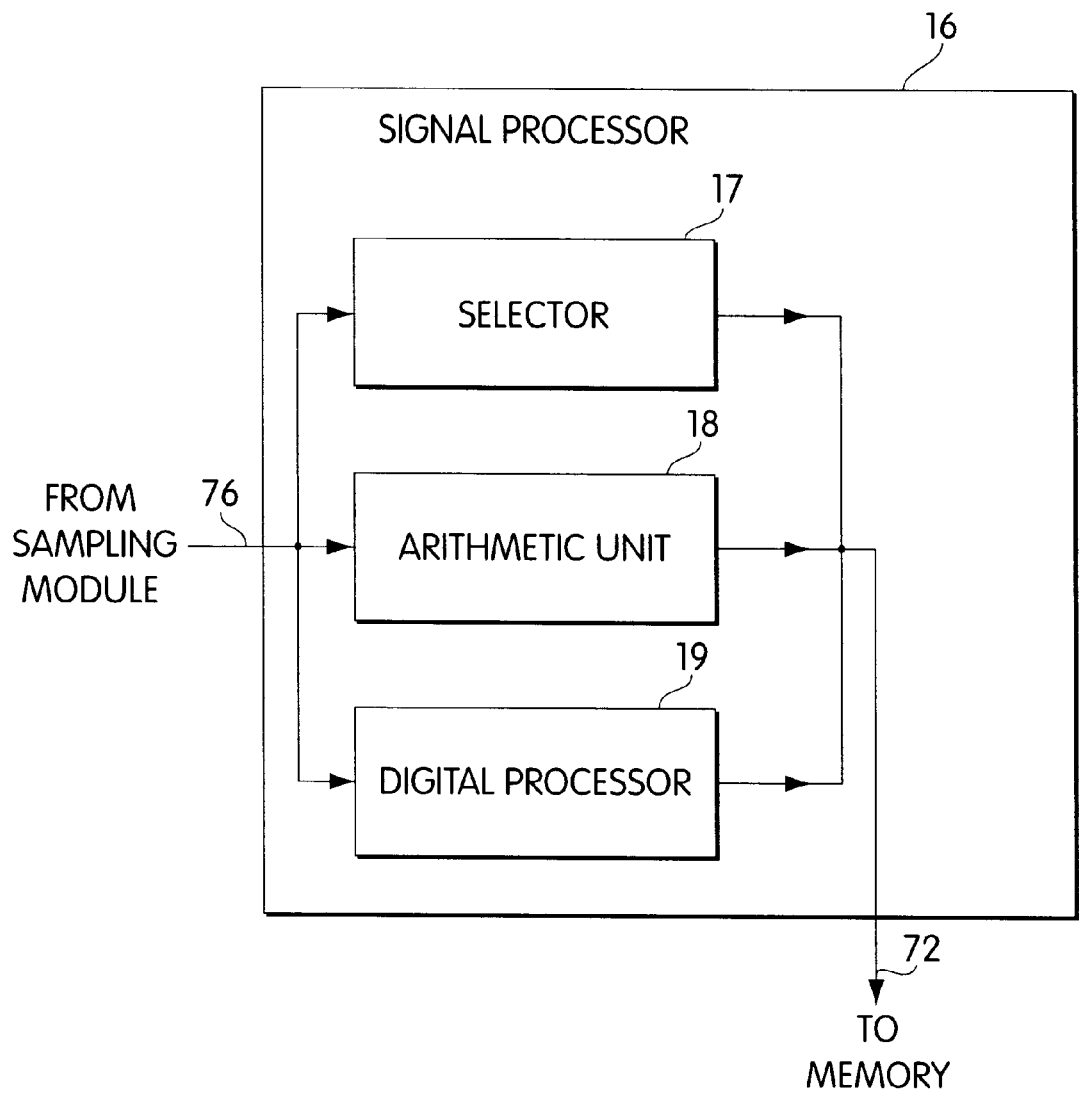
FIG. 4 is a detailed block diagram of a signal processor of the apparatus of FIG. 3.

FIG. 4 shows a more detailed block diagram of the signal processor 16 of the automatic acquisition module 5. The signal processor 16 may include a selector 17 to select one of the acquired sample sets to be stored in memory. For example, the selector may select the last acquired sample set, acquired at the expiration of the waveform acquisition period, to be stored to memory. Signal processor 16 may also include an arithmetic unit 18 to calculate an average sample set from the acquired sample sets to be stored to memory.

Additionally, FIG. 4 shows that signal processor 16 may include a digital processor 19 to filter the acquired sample sets to determine the selected sample set for each measurement.

Digital processor 19 may be constructed and arranged so as to implement any number of digital signal processing techniques known in the art. For purposes of the present invention, any analog and/or digital signal processing technique may be utilized to determine each selected sample set from the acquired sample sets. For example, selector 17, arithmetic unit 18, and digital processor 19 of FIG. 4 may be used alone or in combination with each other to determine a selected sample set from the acquired sample sets.

Returning to FIG. 3, the automatic acquisition module 5 further includes an input and triggering module 6. FIG. 3 shows that the input and triggering module 6 includes a plurality of waveform channels 7. For example, many waveform measuring instruments known in the art typically include two or more input waveform channels, wherein each waveform channel may include some form of impedance matching and waveform conditioning circuitry. In this manner, a number of waveforms of interest may be measured by one or more probes similar to measurement probe 10, to provide measured waveforms to the measuring instrument.

In the input and triggering module 6 shown in FIG. 3, an amplifier 8 is associated with each waveform channel 7. Each amplifier 8 provides signal amplification or attenuation to a respective waveform channel for conditioning a particular probed waveform. The amplification or attenuation provided by each amplifier is referred to as the gain or "vertical sensitivity" of the amplifier. The term "vertical sensitivity" is used in the art in conjunction with waveform amplification as it relates to the video display generally associated with waveform measuring instruments, in which a vertical display axis typically represents waveform amplitude.

As shown in FIG. 3, the input and triggering module 6 may include a number of waveform channels 7 and associated amplifiers 8, to which a number of probes and cables similar to measurement probe 10 and cable 74 may be respectively connected. Processor 38 of the control unit 30, shown in FIG. 2, controls the input and triggering module via control line 70 so as to select one of the waveform channels 7 at any given time to provide the probed waveform 11 to the detection module 12. Hence, the probed waveform 11 shown in FIG. 3 may be a conditioned (amplified or attenuated) version of one of several waveforms input to the input and triggering module 6. The operator interface module 32 of FIG. 2 includes an input 34 to allow the operator to select a particular waveform channel of interest.

FIG. 3 additionally shows that the detection module 12 includes an auto-scale module 13 to optimize the vertical sensitivity of the amplifier 8 corresponding to the selected waveform channel 7, based on the amplitude of the probed waveform 11. The auto-scale module 13 determines if further amplification of a waveform as measured by probe 10 is possible without saturating the amplifier 8, and if possible, the auto scale module 13 automatically increases the vertical sensitivity of the amplifier accordingly. Similarly, if the auto-scale module 13 senses that the amplifier is saturated, it decreases the vertical sensitivity of the amplifier 8. In this manner, the auto-scale module 13 insures that the dynamic range of amplifier 8 is utilized as effectively as possible to provide the probed waveform 11 to the detection module 12.

The input and triggering module 6 shown in FIG. 3 also includes at least one external trigger input 9 to receive an external trigger source. A trigger source refers to a periodic signal that activates a timing reference or "time base" of the measuring instrument used for waveform measurements. Various methods and apparatus for providing time bases are well known in the art. Possible trigger sources for a measuring instrument such as an oscilloscope or spectrum analyzer may include, but are not limited to, the power supply line used to power the measuring instrument, or a dedicated timing circuit internal to the measuring instrument. A probed waveform itself, as measured by probe 10, may also provide the trigger source, or an arbitrary waveform may be applied to the external trigger input 9 and may serve as the trigger source.

While a time base or timing reference module for the waveform measuring instrument is not explicitly shown in FIG. 3, the timing information provided by a trigger source, in some cases by way of external trigger input 9, may be utilized by the sampling module 14 in a known manner to acquire sample sets of the probed waveform 11. A point along a trigger source waveform that is specifically used to activate a timing reference is commonly referred to as a "trigger." The operator interface module 32 shown in FIG. 2 may include an operator input 34 to select a trigger source. As discussed above, a suitable trigger source may be provided by an internal dedicated timing circuit, by the waveform of interest itself, or by an arbitrary external trigger source. When a desired trigger source is selected, the operator has the option to additionally specify the waveform acquisition period as a predetermined count of triggers.

Figure 5:
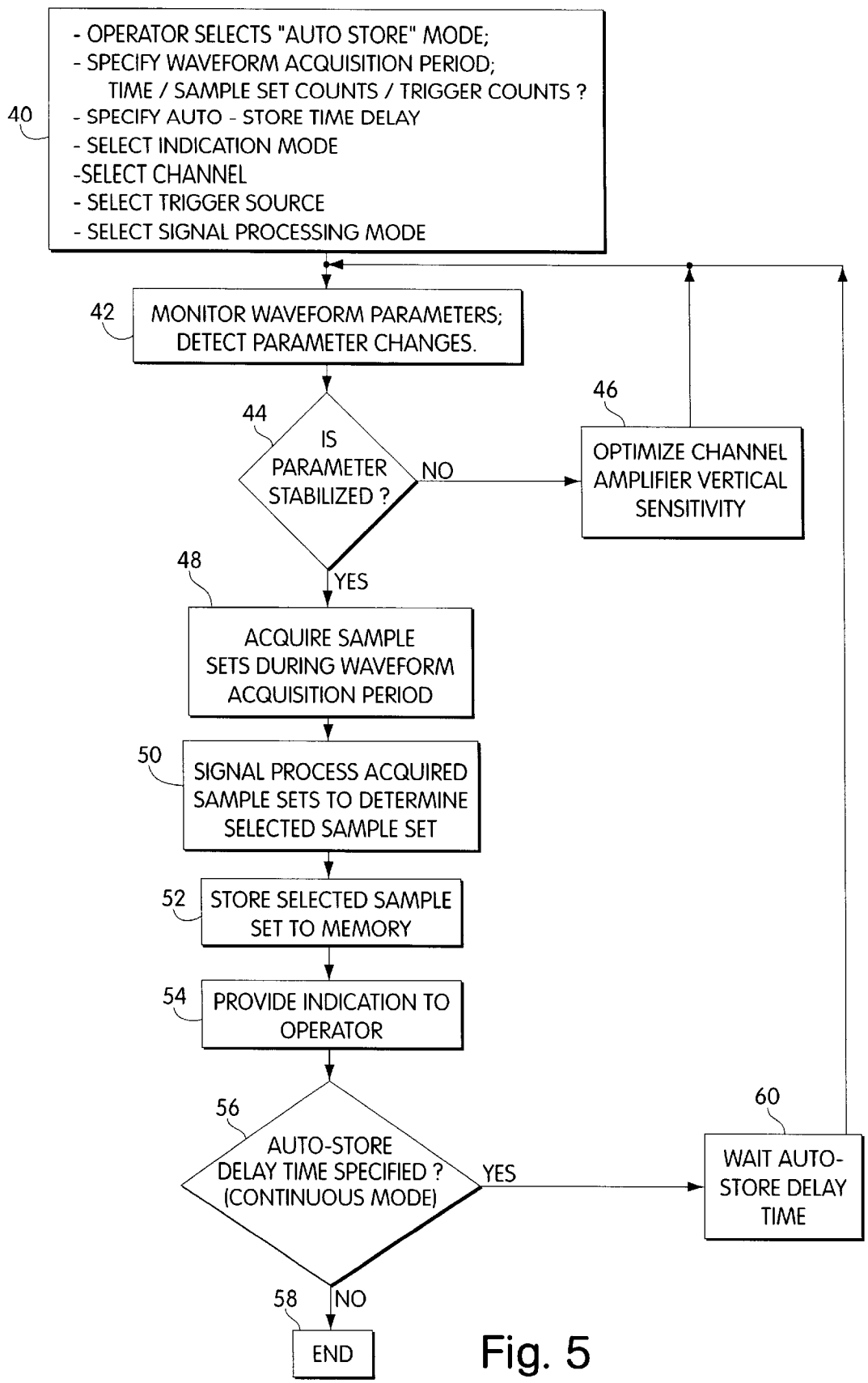
FIG. 5 is a flow chart diagram illustrating an example of a method, according to the invention, of automatically acquiring and storing a waveform measurement and indicating the success thereof.

FIG. 5 is a flow chart illustrating an example of a method of automatically measuring a probed waveform according to the invention. Beginning with step 40, the operator selects an "auto-store" mode to automatically acquire and store waveform measurements according to the invention. The operator may then instruct or "arm" the measuring instrument to automatically acquire a number of sample sets, and determine and store a selected sample set representing the waveform of interest. The step of arming may include, for example, selecting a channel of the measuring instrument on which to acquire samples of the waveform, selecting; a trigger source, specifying a waveform acquisition period and an auto-store delay time for continuous acquisition and storage of a series of measurements, and selecting an indication mode. It should be appreciated that the step of arming the measuring instrument may include various other steps that pertain to a specific measuring instrument, and that some steps may differ for different instruments.

As discussed above, during the step of arming, the operator may specify the waveform acquisition period as a predetermined measurement time, a predetermined count of acquired sample sets, or as a predetermined count of triggers. Additionally, a signal processing mode may be specified by the operator, such as averaging or digital processing of the acquired sample sets.

The waveform of interest is acquired by first monitoring a parameter of the waveform and detecting a change in the monitored parameter, as shown in step 42. Examples of waveform parameters monitored according to methods of the invention may include the waveform amplitude or frequency. In step 44, the example method of FIG. 5 allows for the monitored parameter of the waveform of interest to stabilize for a predetermined stabilization time. In step 46, the amplification or attenuation applied to the waveform of interest by the amplifier associated with the selected channel is optimized by adjusting the vertical sensitivity of the amplifier while the waveform amplitude is stabilizing. Should the waveform amplitude fluctuate during stabilization, the vertical sensitivity of the amplifier associated with the selected channel is optimized to accommodate the fluctuations in waveform amplitude, as discussed above in connection with the input and triggering module 6 of FIG. 3.

Following parameter stabilization, sample sets of the monitored waveform are acquired in step 48 during the specified waveform acquisition period following the predetermined stabilization time. At the expiration of the waveform acquisition period, the acquired sample sets of the monitored waveform are signal processed in step 50 to determine a selected sample set, and in step 52 the selected sample set is stored to memory. Once the selected sample set is stored to memory, at least one indication is provided to the operator in step 54. Step 56 determines if the operator has selected a continuous automatic acquire and store procedure by selecting an auto-store delay time in step 40. If the answer is yes, the method waits for the auto-store delay time, indicated in step 60, and then returns to step 42, wherein a parameter of a new waveform of interest is monitored. The new waveform of interest may be the same waveform at some later time, or a waveform from a different source. If a continuous automatic acquire and store procedure has not been selected by the operator, the method is completed with the indication of step 54, and the process ends at step 58.

According to the method and apparatus of the invention as described herein, an operator can perform an initial setup by selecting functions and parameters of a measuring instrument, probe a waveform of interest, and have the measuring instrument indicate that a waveform measurement has been automatically acquired and stored, while the operator is free to perform other tasks. In particular, the operator can perform a waveform measurement without ever having to take his or her eyes off of a measurement probe during the acquisition and storage. As a result, the risk of accidentally moving the probe to a position that might cause unreliable measurements or damage circuitry is reduced. The method and apparatus of the invention may be conveniently applied to a single waveform measurement or to a number of consecutive measurements, the operator being alerted of the successful acquisition and storage of each measurement by an indication provided by the measuring instrument.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting.

What is claimed is:

1. A waveform measuring apparatus, comprising:
 a display device;
 a memory device; and
 an automatic acquisition module configured to receive one or more operator generated instrument instructions at a first time period and, in a second time period subsequent to said first time period, to execute, without operator intervention operator generated said instrument instructions, wherein said operator generated instrument instructions cause said waveform measuring apparatus to perform one or more measurement operations without operator invocation, wherein during each said measurement operation said acquisition module acquires one or more sample sets of a probed waveform during a waveform acquisition period, determines a selected one of said acquired sample sets, stores said selected sample set in said memory device, and displays on said display device a representation of said selected sample set of said probed waveform.

2. The apparatus of claim 1, wherein said one or more operator generated instrument instructions comprise:
 a first instrument instruction specifying said waveform acquisition period.

3. The apparatus of claim 2, wherein said automatic acquisition module determines said selected sample set from said one or more acquired sample sets.

4. The apparatus of claim 3, wherein said selected sample set is selected by said acquisition module at an expiration of said waveform acquisition period based on a plurality of acquired sample sets.

5. The apparatus of claim 3, wherein said one or more instrument instructions comprises:
 a second instrument instruction specifying an auto-store delay time between determinations and storage of consecutive selected sample sets of said at least one selected sample set.

6. The apparatus of claim 5, wherein said automatic acquisition module acquires said waveform acquisition period begins in response to a detected stabilization of one or more monitored parameters of the probed waveform.

7. The apparatus of claim 6, wherein said automatic acquisition module comprises:
 a detection module constructed and arranged to detect a change in one or more said one or more monitored parameters, and wait a predetermined stabilization time for the monitored parameter to be substantially constant, all without operator involvement and in response to said instrument instructions;
 a sampling module constructed and arranged to acquire, after the predetermined stabilization time, said one or more stop automatically said sample set acquisitions at the expiration of said waveform acquisition period; and
 a signal processor constructed and arranged to process said one or more acquired sample sets to select a particular one of said one or more sample sets.

8. The apparatus of claim 7, wherein said selected sample set is a last acquired sample set of a plurality of sample sets acquired during said waveform acquisition period.

9. The apparatus of claim 7, wherein said selected sample set is a calculated average sample set calculated from said plurality of acquired sample sets.

10. The apparatus of claim 7, wherein said automatic acquisition module further comprises:

an input and triggering module including a plurality of waveform channels at which said input and triggering module receives a plurality of probed waveforms; and at least one trigger input to receive a trigger indication from an external trigger source; and wherein said operator generated instrument instructions further includes, a third instrument instruction specifying which of said plurality of waveform channels to select to provide the probed waveform; and a fourth instrument instruction specifying said external trigger source.

11. The apparatus of claim 10, wherein said monitored parameter is an amplitude of the probed waveform, wherein said input and trigger module includes an amplifier for each of the plurality of waveform channels, each amplifier having a vertical sensitivity; and wherein said detection module includes an auto-scale module to optimize the vertical sensitivity of the amplifier associated with the selected one of the plurality of waveform channels, based on the amplitude.

12. The apparatus of claim 1, further comprising an indicator, wherein said automatic acquisition module is further configured to exercise said indicator to provide an indication that a selected sample set has been stored in said memory device.

13. The apparatus of claim 1, wherein said automatic acquisition module displays on said display device a representation of said selected sample set of said probed waveform.

14. A waveform measuring method, comprising the steps of:

(A) receiving one or more operator generated instrument instructions that instruct a waveform measuring apparatus to automatically acquire a plurality of acquired sample sets of a probed waveform and to determine and store a selected sample set from said acquired sample sets;

(B) acquiring, subsequent to the completion of said receiving step and without operator involvement, said plurality of sample sets during a waveform acquisition period;

(C) determining which of said acquired sample sets is to be said selected sample set; and (D) storing said selected sample set in a memory device.

15. The method of claim 14, wherein said step (B) comprises the steps of:

(1) acquiring automatically a plurality of sample sets of the probed waveform during said waveform acquisition period; and (2) determining said selected sample set based on said plurality of acquired sample sets at an expiration of the waveform acquisition period; and wherein said step (D) includes a step of:

(1) storing each at least one selected sample set in memory.

16. The method of claim 15, wherein said step (A) comprises a step of:

(1) receiving an operator generated instrument instruction specifying said waveform acquisition period.

17. The method of claim 16, wherein said step (A)(1) comprises a step of:

a) receiving an operator generated instrument instruction specifying said waveform acquisition period as a predetermined measurement time.

18. The method of claim 16, wherein said step (A)(1) includes a step of:

a receiving an operator generated instrument instruction specifying the waveform acquisition period as a predetermined count of acquired sample sets.

19. The method of claim 15, wherein said step (A) comprises a step of:

(1) receiving an operator generated instrument instruction specifying an auto-store delay time between determinations and storage of consecutive selected sample sets of the at least one selected sample set.

20. The method of claim 15, wherein said step (B)(1) comprises steps of:

a) monitoring a parameter of the probed waveform;

b) detecting a change in the monitored parameter;

c) waiting a predetermined stabilization time for the monitored parameter to be substantially constant;

d) sampling the probed waveform, after the predetermined stabilization time, to acquire the plurality of acquired sample sets; and e) stopping acquisition of the plurality of acquired sample sets at the expiration of the waveform acquisition period.

21. The method of claim 20, wherein said step (B)(2) of determining said at least one selected sample set comprises a step of:

a) processing said plurality of acquired sample sets to determine a particular selected sample set of said at least one selected sample set.

22. The method of claim 21, wherein said step of (B)(2)a) of processing comprises a step of:

1) selecting a last acquired sample set of the plurality of acquired sample sets as said particular selected sample set, said last acquired sample set being acquired at the expiration of said waveform acquisition period.

23. The method of claim 21, wherein said step of (B)(2)a) of processing comprises a step of:

1) calculating an average sample set from the plurality of acquired sample sets as the particular selected sample set.

24. The method of claim 21, wherein said step of (B)(2)a) of processing includes a step of:

1) digitally filtering the plurality of acquired sample sets to determine the particular selected sample set.

25. The method of claim 21, wherein said step (A) comprises the steps of:

(1) selecting a channel of the measuring instrument on which to measure the probed waveform; and (2) selecting a trigger source.

26. The method of claim 25, wherein said step (A)(2) of selecting a trigger source comprises the step of:

a) selecting the probed waveform as the trigger source; and wherein the step (A)(1) of receiving an instruction specifying the waveform acquisition period comprises the step of:

a) receiving an instruction specifying the waveform acquisition period as a predetermined count of triggers.

27. The method of claim 25, wherein:

wherein said monitored parameter comprises an amplitude of said probed waveform; and wherein said step (B)(1)c) of waiting a predetermined stabilization time includes a step of:

1) optimizing a vertical sensitivity of the selected channel based on the amplitude.

28. The method of claim 14, further comprising a step of:
(E) indicating that each at least one selected sample set is determined and stored.

29. The method of claim 28, wherein said indicating step (E) comprises a step of:
(1) audibly indicating that each at least one selected sample set is determined and stored.

30. The method of claim 28, wherein said indicating step (E) comprises the steps of:
(1) specifying an indication mode that assigns a unique one of a plurality of patterns of indications to a respective one of the at least one selected sample set being determined and stored; and
(2) indicating the unique one of a plurality of patterns of indications when the respective one of the at least one selected sample set is determined and stored.

31. A waveform measuring apparatus, comprising:
an automatic acquisition module to automatically acquire a plurality of sample sets of a probed waveform during a waveform acquisition period, and to determine at least one selected sample set based on the plurality of acquired sample sets at an expiration of the waveform acquisition period;
a memory to store each at least one selected sample set;
a video display to display a representation of the probed waveform based on each at least one selected sample set; and
a control unit to control the automatic acquisition module, the memory, and the video display, including:
an operator interface module to provide instructions to the measuring apparatus, wherein the operator interface module includes,
a plurality of operator inputs to provide the instructions to the measuring apparatus, the plurality of operator inputs including a first operator input to specify the waveform acquisition period and a second operator input to specify an auto-store delay time between determinations and storage of consecutive selected sample sets of the at least one selected sample set; and
a processor, coupled to the automatic acquisition module, the memory, the video display, and the operator interface module, to control the automatic acquisition module, the memory, and the video display based on the instructions provided by the operator interface module.

32. A waveform measuring apparatus, comprising:
an automatic acquisition module to automatically acquire a plurality of acquired sample sets of a probed waveform during a waveform acquisition period, and to determine at least one selected sample set based on the plurality of acquired sample sets at an expiration of the waveform acquisition period, including,
a detection module to monitor a parameter of the probed waveform, detect a change in the monitored parameter, and wait a predetermined stabilization time for the monitored parameter to be substantially constant;
a sampling module to acquire, after the predetermined stabilization time, the plurality of acquired sample sets and to automatically stop acquisitions of the plurality of acquired sample sets at the expiration of the waveform acquisition period; and
a signal processor to process the plurality of acquired sample sets to determine a particular selected sample set of the at least one selected sample set, wherein said particular selected sample set is an average sample set from the plurality of acquired sample sets;
a memory to store each at least one selected sample set;
a video display to display a representation of the probed waveform based on each at least one selected sample set; and
a control unit to control the automatic acquisition module, the memory, and the video display, including,
an operator interface module to provide instructions to the measuring apparatus; and
a processor, coupled to the automatic acquisition module, the memory, the video display, and the operator interface module, to control the automatic acquisition module, the memory, and the video display based on the instructions provided by the operator interface module.

33. A waveform measuring method, comprising steps of:
automatically acquiring at least one sample set of a probed waveform during a waveform acquisition period, including the steps of,
automatically acquiring a plurality of sample sets of the probed waveform during the waveform acquisition period; and
determining at least one selected sample set based on the plurality of acquired sample sets at an expiration of the waveform acquisition period; and
storing each at least one sample set in memory, including a step of,
storing each at least one selected sample set in memory; and
instructing a waveform measuring apparatus to automatically acquire the plurality of acquired sample sets and determine and store each at least one selected set, including a step of,
specifying an auto-store delay time between determinations and storage of consecutive selected sample sets of the at least one selected sample set.

34. A waveform measuring method, comprising steps of:
automatically acquiring at least one sample set of a probed waveform during a waveform acquisition period, including the steps of:
automatically acquiring a plurality of sample sets of the probed waveform during the waveform acquisition period, and
determining at least one selected sample set based on the plurality of acquired sample sets at an expiration of the waveform acquisition period;
storing each at least one selected sample set in memory; and
instructing a waveform measuring apparatus to automatically acquire the plurality of acquired sample sets and determine and store each at least one selected set, including,
specifying the waveform acquisition period as a predetermined count of acquired sample sets.

* * * * *